United States Patent [19]

Park

[11] Patent Number: 5,785,398
[45] Date of Patent: Jul. 28, 1998

[54] DEVICE FOR FASTENING COMPUTER CASE

[75] Inventor: Sang-Seok Park, Suwon, Rep. of Korea

[73] Assignee: Samsung Electronics Co., Ltd., Kyungki-do, Rep. of Korea

[21] Appl. No.: 612,790

[22] Filed: Mar. 11, 1996

[30] Foreign Application Priority Data

Mar. 10, 1995 [KR] Rep. of Korea ............... 1995/4184

[51] Int. Cl.⁶ ............................................. H05K 5/00
[52] U.S. Cl. .............................. 312/223.2; 312/265.6; 292/128; 292/DIG. 37
[58] Field of Search ........................... 361/725, 726, 361/732, 829, 685, 684; 312/223.1, 223.2, 263, 265.6, 265.5, 111, 319.1, 319.2; 292/128, 228, DIG. 37

[56] References Cited

U.S. PATENT DOCUMENTS

| | | | |
|---|---|---|---|
| 2,858,179 | 10/1958 | Puerner et al. | 312/257.1 X |
| 4,186,976 | 2/1980 | Okada | 312/265.5 X |
| 4,893,850 | 1/1990 | Mizusawa | 292/128 |
| 4,940,414 | 7/1990 | Lee | 439/131 |
| 5,010,426 | 4/1991 | Krenz . | |
| 5,036,430 | 7/1991 | Hills | 361/684 |
| 5,121,296 | 6/1992 | Hsu . | |
| 5,151,847 | 9/1992 | Rautenberg . | |
| 5,164,886 | 11/1992 | Chang | 312/257.1 X |
| 5,269,598 | 12/1993 | Liu | 312/223.2 |
| 5,321,962 | 6/1994 | Ferchau et al. . | |
| 5,348,268 | 9/1994 | Klein | 312/319.2 X |
| 5,423,605 | 6/1995 | Liu . | |
| 5,446,618 | 8/1995 | Tetsuya et al. . | |
| 5,508,886 | 4/1996 | Bernecker et al. | 361/725 X |

FOREIGN PATENT DOCUMENTS

| | | | |
|---|---|---|---|
| 1384767 | 11/1964 | France | 292/128 |
| 3290994 | 12/1991 | Japan | 361/726 |
| 5257569 | 10/1993 | Japan | 361/726 |
| 2192927 | 1/1988 | United Kingdom | 292/228 |

*Primary Examiner*—Peter M. Cuomo
*Assistant Examiner*—Janet M. Wilkens
*Attorney, Agent, or Firm*—Robert E. Bushnell, Esq.

[57] ABSTRACT

A computer case including two pairs of apertures, a first pair accommodating the push buttons and a second pair accommodating and engaging a pair of locking hooks. The hooks are biased closed by a torsion spring. The hooks and the push buttons are formed integrally on a single monolithic fastening latch which pivots about a support shaft. A support bar is placed behind the push buttons to prevent the push buttons from being pushed in too far preventing the springs from being compressed too much.

24 Claims, 4 Drawing Sheets

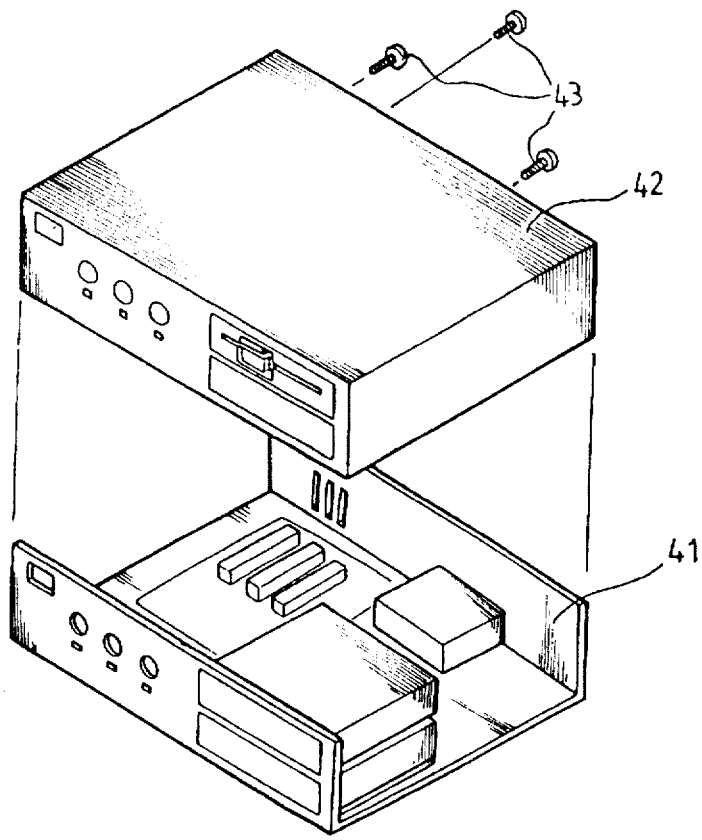
FIG. 1 *PRIOR ART*
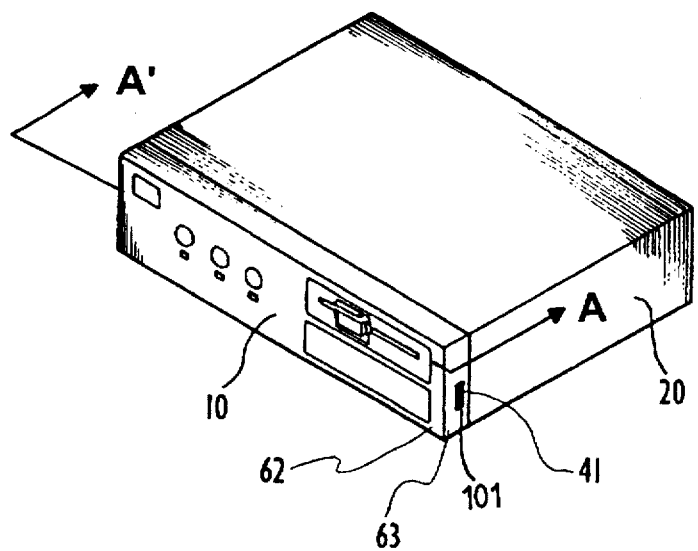
FIG. 2

DEVICE FOR FASTENING COMPUTER CASE

CROSS-REFERENCE TO RELATED APPLICATIONS

This application makes reference to, incorporates the same herein, and claims all benefits accruing under 35 U.S.C. §119 arising from an application for Device For Fastening Computer Case earlier filed in the Korean Industrial Property Office on 10 Mar. 1995 and there duly assigned Ser. No. 4184/1995.

FIELD OF THE INVENTION

The present invention relates to a device for fastening a computer case, and more particularly, to a device for fastening a computer case in which the computer case can be assembled and disassembled by manipulating a push button provided for the computer case.

BACKGROUND OF THE INVENTION

A spring loaded rotatable latch with a push button feature placed on opposite sides of a computer cover can be used to separate a computer case cover from a computer chassis, eliminating the need for screws or special tools. U.S. Pat. No. 5,321,962 to Ferchau provides one type of such an injector and ejector mechanism for a computer module. A torsion spring works to pivot a bias trigger to an engaged position. A serrated surface on trigger engages with a complementary serrated surface to keep the trigger in a locked position absent external pressure. Ferchau '962 does not engage the trigger by use of a hook and an aperture combined, but instead requires a user to press a surface which pivots the trigger away from the engaged position. This permits the user to move the handle from the locked position to the unlocked position. I have noticed however, that the trigger may be pressed inwardly too far, thereby subjecting the torsion spring to unnecessary compression, wear and ultimate failure.

U.S. Pat. No. 5,423,605 to Liu provides a more recent design using a mechanism for engaging and disengaging a front panel of a computer from a case for the computer. The user must insert his fingers into a pair of notches to bend a pair of flexible strips to allow a pair of hooks to disengage from a pair of openings allowing the user to remove the computer front panel from the computer casing. Continued deflection of the flexible strips during forced closing, in combination with the cantilevered length of the strips, exposes the strips to early breakage from repeated use, thus rendering the front panel unattachable to the case.

SUMMARY OF THE INVENTION

It is the object of the present invention to provide an improved assembly for fastening together the joinable parts of a computer case for a computer.

It is another object of the present invention to provide a device for fastening a computer case, in which the computer case can be disassembled by a single manipulation without use of special tools, thereby providing an improved convenience to users.

It is a further object to facilitate opening and closing of a computer case with spring loaded latches operable via a push button installed on opposite sides a front panel.

It is still another object to engage a computer chassis to a computer case by locking a hook inside an aperture.

It is yet another object to preserve the integrity of the springs of a locking mechanism by placing support bars behind push buttons to limit the distance that a push button may be depressed and to thereby limit the amount that the springs may be compressed.

It is also another object of the present invention to provide a process for opening and closing a computer case without the use of special tools where a pair of push buttons are depressed simultaneous to the pulling of the front panel away from the chassis.

These and other objects may be achieved with a device that allows the user to disengage and engage a computer case having a computer chassis, without the use of screws or special tools. Two pairs of apertures are incorporated into the device, with one pair accommodating the push buttons and the other pair accommodating and engaging a pair of locking hooks. The hooks are bias closed by a torsion spring. The hooks and the push buttons are formed integrally on a single monolithic fastening part which pivots about a support shaft. A support bar is placed behind the push buttons to prevent the push buttons from being pushed inwardly too far preventing the springs from being excessively compressed.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 illustrates the assembly procedure for a conventional computer case;

FIG. 2 illustrates a closed and fastened state of the computer case constructed according to the principles of the present invention;

DETAILED DESCRIPTION OF THE INVENTION

Figure 3:
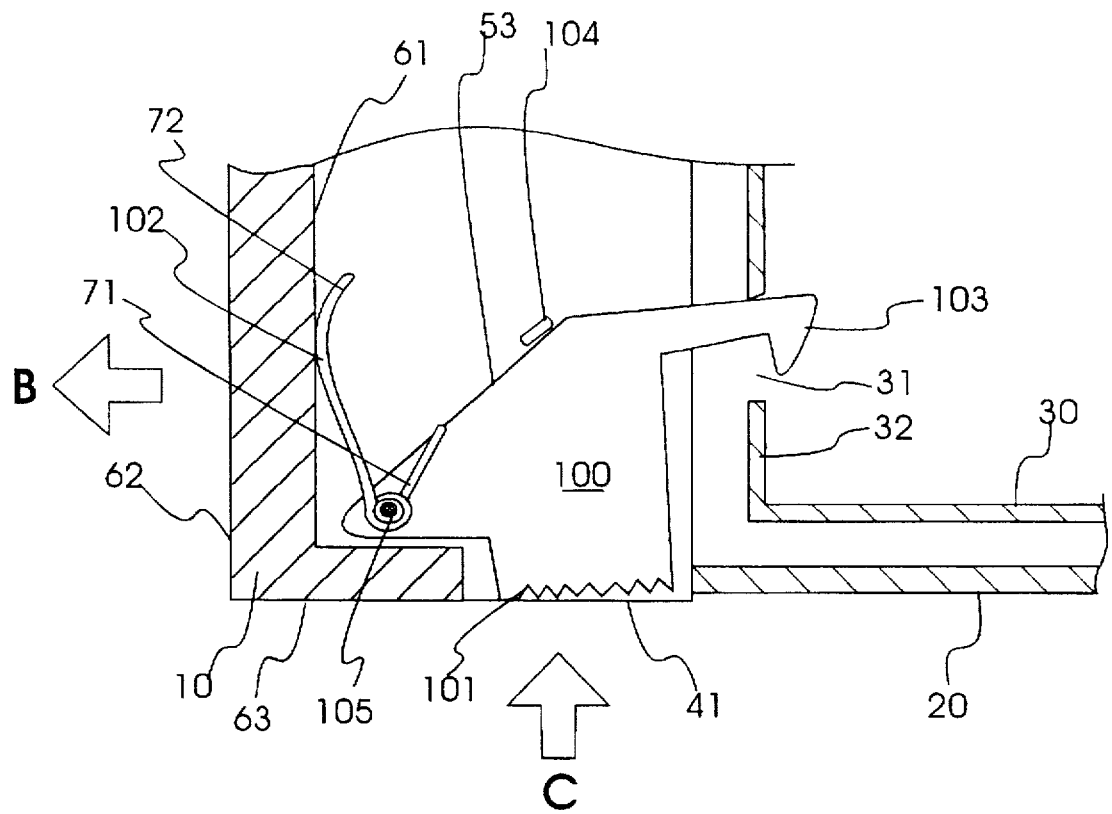
FIG. 3 is a sectional plan view of the fastening device constructed according to the principles of the present invention while in an unfastened position.

Turning now to the drawings, FIG. 1 illustrates the assembly procedure for a conventional computer case. Cover 42 can only be removed from chassis 41 by unscrewing screws 43 using a screwdriver. The case in FIG. 1 is not able to be opened or secured with bare hands. FIG. 2 illustrates a fastened state of the computer case according to the practice of the present invention. Unlike the computer case in FIG. 1, the computer case in FIG. 2 may be disassembled or reassembled using only bare hands. Push buttons 101 in aperture 41 in sidewalls 63 of front panel 10 allow a user to open the case by simply depressing both push buttons 101 simultaneously and pulling out front panel 10 from main chassis 30.

Figure 4:
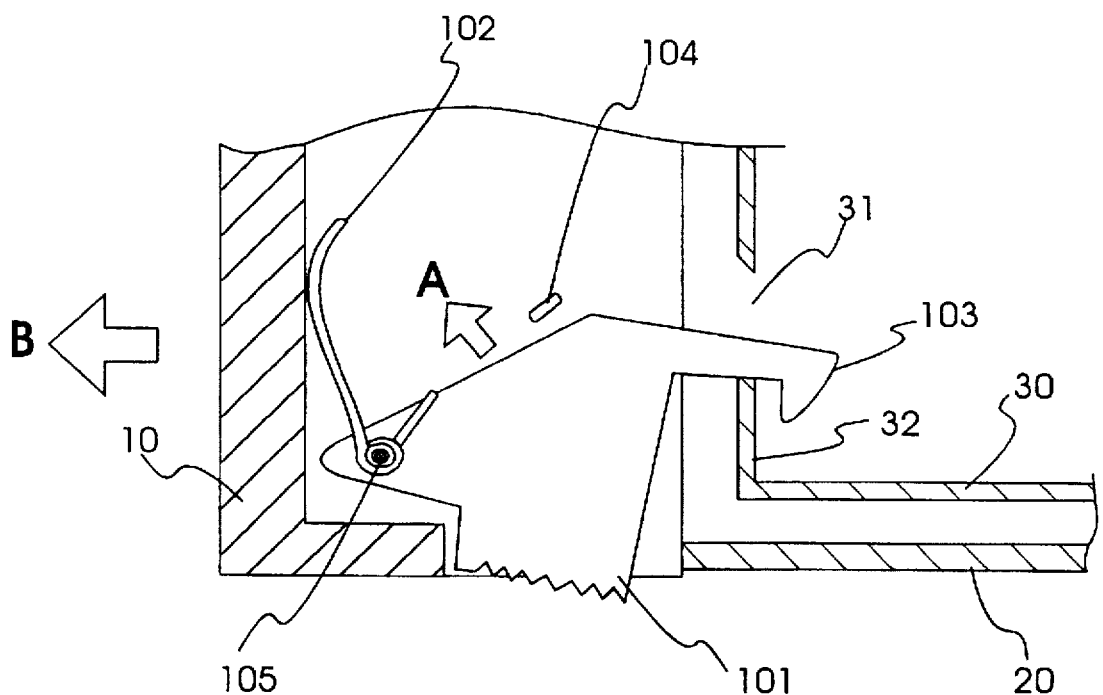
FIG. 4 is a sectional plan view of the computer case fastening device constructed according to the principles of the present invention while in a fastened position.
Figure 5:
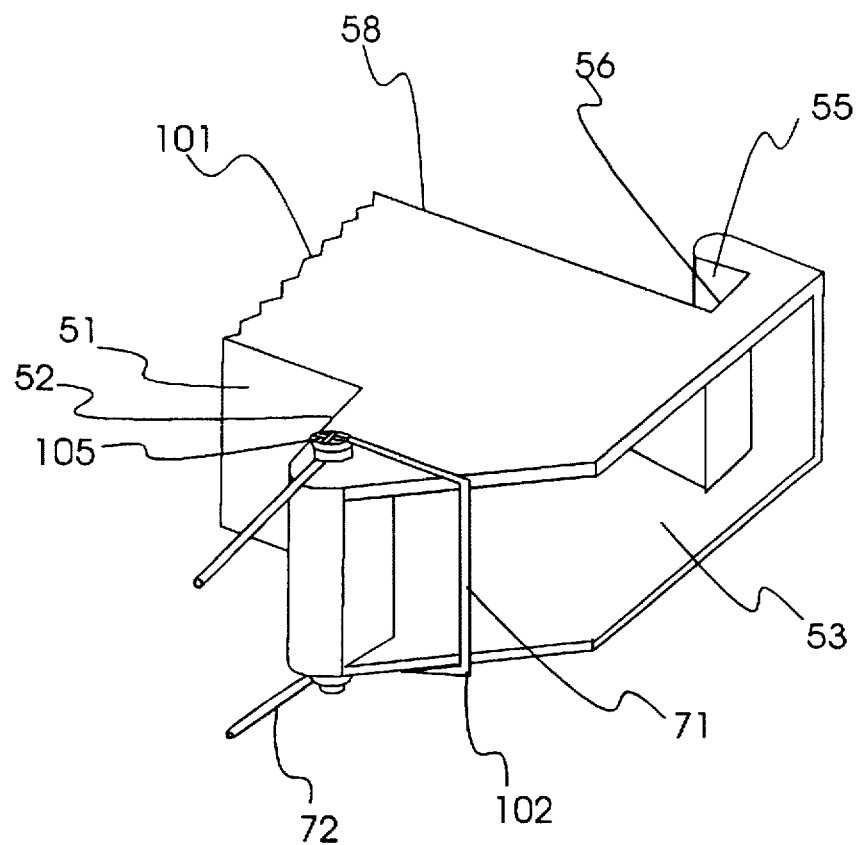
FIG. 5 is a perspective view of the fastening latch according to the present invention.
Figure 6:
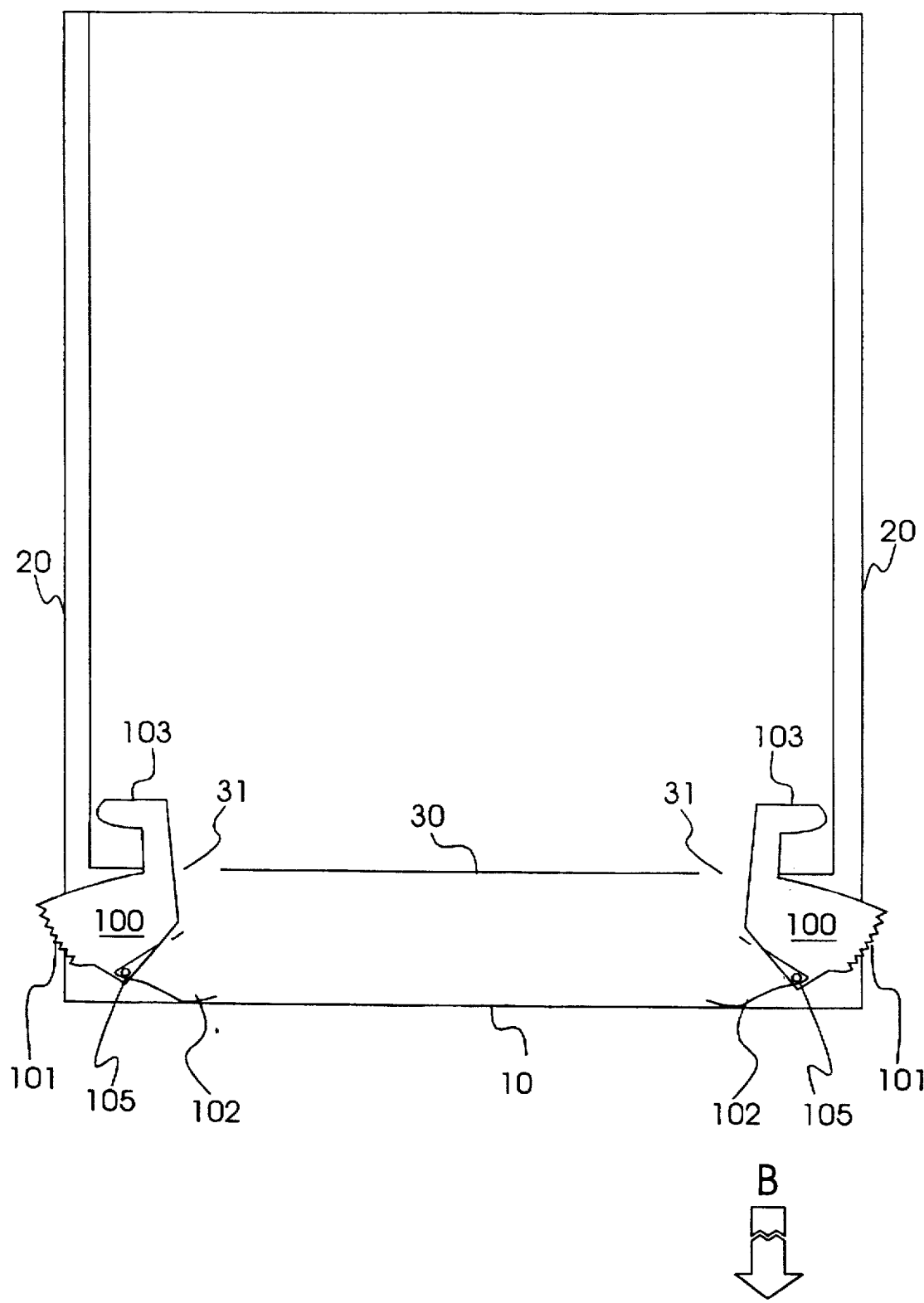
FIG. 6 is a cross sectional view of FIG. 2 taken in the direction of AA'.

As shown in FIG. 3, fastening latch 100 for fastening main chassis 30 to computer case 20 includes push buttons 101 installed in opposite sides of the case in apertures 41 of sidewalls 63 of front panel 10 Push buttons 101 move fastening latch 100 from the engaged to the disengaged position. Hook 103 is formed integrally with push button 101 so that when a user depresses push button 101 in the "C" direction, engaging surface 55 of hook 103 can be disengaged from engaging wall 32 of main chassis 30. Spring 102 biases hook 103 to the engaged (i.e. inserted) position absent external pressure by a user on inside surface 53 of push button 101. Supporting shaft 105 supports spring 102 while supporting bar 104 limits the range a user can push in push button 101 of fastening latch 100. During times in which computer case 20 and main chassis 30 are not disassembled from each other, engaging surface 55 of hook 103 of fastening latch 100 is maintained inserted into latch aperture of main chassis 30 and engaged with engaging wall 32 as shown in FIG. 4 on account of the elastic force of spring 102 which is installed between front panel 10 and fastening latch 100 as shown in FIG. 5. FIG. 6 is a top view looking down onto the fastening mechanism described in this invention. FIG. 6 shows two fastening latches in the engaged position.

Front panel 10 is formed integrally with computer case 20. Fastening latches 100, which are used for fastening main chassis 30 to computer case 20, are installed on both sides of front panel 10 of the computer. Front panel 10 of the case encompasses both the front wall 62 of the case and a flange adjacent to front wall 62 running around the entire case. Sidewalls 63 form part of this flange and are perforated with apertures 41 to accommodate and expose push buttons 101. On the other side of front wall 62 is inside wall 61. Inside wall 61 faces both the fastening latches 100 and the rear of the case. Inside wall 61 is used to support torsion spring 102 against fastening latch 100 so that fastening latch remains engaged.

Referring to FIG. 5, fastening latch 100 may be described and operated as follows. In the rear of fastening latch 100, hook 103 protrudes. Hook 103 is comprised of engaging surface 55 facing the front, cantilevered surface 56 facing the side of the case. Back wall 58 facing hook 103 and the rear of the case lies adjacent to cantilevered surface 56 and push button 101. Push button 101, adjacent to back wall 58, protrudes from apertures 41 in sidewall 63 of the flange of front panel 10. Adjacent to push button 101 is a small surface that faces the front of the case and lies near aperture 41 in front panel 10. This surface is called aperture wall 51 of fastening latch 100. Adjacent to aperture wall 51 is side spring wall 52 which faces sidewall 63 and, unlike push button 101, is obscured from a user by sidewall 63 of front panel 10. Aperture wall 51 lies closer to the front wall 62 of the case than does push button 101.

Torsion springs 102 are used to bias fastening latches 100 to an engaged state when there is external force on push buttons 101. Torsion springs 102 are coiled about supporting shafts 105 of fastening latches 100. Two loops of torsion spring 102 on opposite sides of supporting shaft 105. Front loop 72 is in contact with inside wall 61 of front panel 10. Rear loop 71 is in contact with inside surface 54 of fastening latch 100. The inherent bias of torsion spring 102 is for rear loop 71 to move away from front loop 72. What prevents loops 71 and 72 from separating is inside wall 61 of front panel 10 on the front side and inside surface 53 of fastening latch 100 on the rear side.

Since front panel 10 and computer case 20 are formed integrally together, computer case 20 is accurately aligned with and tightly fitted against main chassis 30, as shown in FIG. 2. When computer case 20 is to be detached from main chassis 30, push buttons 101 of fastening latches 100 which are formed at the both sides of front panel 10 as shown in FIG. 2, are pressed inwardly in the "C" direction. Thus if external manual force is applied upon push buttons 101, push buttons 101 of fastening latch 100 rotate supporting shaft 105 toward inside wall 61 of front panel 10 overcoming the elastic force of spring 102 which is supported to fastening latch 100 as shown in FIG. 5. Owing to the moving of push buttons 101, hooks 103 which are formed integrally with push buttons 101 move in the direction "A", with the result that hooks 103 depart from latch aperture 31 of main chassis 30 as illustrated by FIG. 3. If a pulling is carried out in direction "B" when hooks 103 are separated from latch aperturehole 31 of main chassis 30, computer case 20 which is formed integrally with front panel 10 becomes detached from main chassis 30. Thus through a simple manipulation of push buttons 101, computer case 20 can be easily disassembled.

Under this condition, owing to supporting bar 104 which is projected from the bottom or a side of front panel 10, the moving range of fastening latch 100 is limited. Therefore, damage to spring 102 due to an excessive and repeated manipulation of push buttons 101 can be prevented.

According to the present invention as described above, without special tools, the computer case can be easily disassembled from the main chassis by manipulating the push buttons of the both sides of the front panel.

What is claimed is:

1. A computer housing, comprising:
   a computer case having a front panel having left and right sides;
   a main chassis perforated by a pair of apertures;
   a pair of fastening latches rotatably mounted on said left and said right sides respectively of said front panel of said computer case each integrally formed with a button-operated elastic member, said fastening latches being biased to rotate in opposite directions.

2. The housing as claimed in claim 1, wherein each one of said pair of fastening latches comprises:
   a push button installed at said left and said right sides respectively of said front panel of the computer case, for moving its own position in accordance with manipulations of a user;
   a hook formed integrally with said push button, for being inserted into and withdrawn from one of said pair of apertures formed in said main chassis; and
   said elastic member for controlling an actuation of the hook by its own intrinsic elasticity in accordance with the actuation of the push button.

3. The housing as claimed in claim 1, further comprising a supporting bar for limiting the actuation range of each one of said pair of fastening latches upon being actuated by the user.

4. The housing as claimed in claim 3, wherein said supporting bar projects from each side panel of said front panel.

5. A computer housing, comprising:
   a computer case having first and second ends with first and second apertures formed in said first and second ends respectively;
   a main chassis perforated by a third and a fourth aperture;
   fastening means for enabling said fastening and unfastening of said computer case to and from said main chassis, said fastening means comprised of:
   a pair of push buttons respectively positioned within said first and second apertures, each of said push buttons being positioned so that actuation thereof occasions substantially oppositely directed forces, and
   a pair of hooks, respectively integral with said pair of push buttons, rotatably mounted on said computer case for insertion into said third and fourth apertures to fasten said computer case to said main chassis, and withdrawing from said third and fourth apertures to unfasten said computer case from said main chassis; and a pair of springs biasing said fastening means in a direction to fasten said computer case to said main chassis when said pair of hooks are respectively inserted into said third and fourth apertures.

6. The housing in claim 5, further comprising a pair of support bars for respectively limiting distances said pair of push buttons can be depressed so as to limit distances said springs can be compressed.

7. The housing of claim 6, further comprising a front panel integrated with said computer case.

8. The housing of claim 6, further comprising a pair of support shafts for respectively supporting each of said pair of springs.

9. The housing of claim 6, further comprised of said pair of hooks being incapable of uninhibited lateral translation in a direction away from said computer chassis when said pair of hooks are in a fastened position.

10. The housing of claim 6, wherein each one of said pair of springs comprises a fulcrum spring.

11. The housing of claim 5, further comprising a front panel integrated with said computer case.

12. The housing of claim 5, further comprising a pair of support shafts for respectively supporting each of said pair of springs.

13. The housing of claim 5, further comprised of said pair of hooks being incapable of uninhibited lateral translation in a direction away from said computer chassis when said pair of hooks are in a fastened position.

14. The device of claim 5, wherein each one of said pair of springs comprises a fulcrum spring.

15. A process for disengaging a main chassis from a front panel integrated with a computer case, comprising:

pushing in two buttons of a fastening latch simultaneously on both sides of the computer case toward each other with oppositely directed forces causing springs to rotate resulting in hooks on said fastening latch to become disengaged from corresponding apertures in said main chassis; and removing said front panel off said main chassis by pulling said front panel away from said main chassis while depressing both of said buttons.

16. A computer housing, comprising:

a computer case having left and right opposing sides and a front end extending between said left and right opposing sides, and having a first aperture perforating a first one of said opposing sides;

a main chassis having a first end and a second aperture perforating said first end, said second aperture being separate and discrete from said first aperture;

a fastener rotatably mounted within said computer housing between said computer case and said main chassis, enabling fastening and unfastening of said computer case to and from said main chassis, said fastener comprised of:

a push button positioned within said first aperture and exposed by said first aperture to accommodate manual depression towards a second one of said opposing sides, and a hook integral with said push button extending through said second aperture and when latching onto a wall of said first end, fastening said computer case to said main chassis, and unlatching and withdrawing from said second aperture to unfasten said computer case from said main chassis in response to said manual depression while said front panel is pulled away from said main chassis; and spring pivotably biasing said fastener in a direction to fasten said computer case to said main chassis.

17. The housing in claim 16, further comprised of a support bar for respectively limiting distances said push button can be depressed so as to limit distance said spring can be compressed.

18. The housing of claim 16, further comprising a front panel integrated with said computer case.

19. The housing of claim 16, further comprised of said hook when latched being incapable of uninhibited lateral translation in a direction away from said computer chassis when said hook is in a fastened position.

20. The housing of claim 16, wherein said spring comprises a fulcrum spring.

21. A computer housing, comprising:

a computer case integrated to a front panel, said computer case having left and right side panels said left panel having a first aperture and said right panel having a second aperture;

a main chassis having a front side, said front side perforated by a third aperture and a fourth aperture; and a pair of rotatable fasteners, each said rotatable fastener comprising:

a hook for latching onto one of said third aperture and said fourth aperture perforating said main chassis, a pushbutton surface formed integrally with said hook, a fulcrum spring for biasing said hook of said rotatable fastener to engage with one of said third aperture and said fourth aperture perforating said front side of said main chassis, and a pivot about which said hook and said push button surface rotates, said pivot positioned so that said push button surface is located in one of said first aperture and said second aperture perforating said left and right side panels of said computer case, said rotatable fasteners engaging said computer case to said main chassis when both said push button surfaces are not pressed towards each other, and said computer case being disengaged from said main chassis when said push buttons surfaces on respective ones of said pair of fastening devices are pressed towards each other.

22. The computer housing of claim 21, further comprising:

a pair of support bars protruding from said front panel of said computer case for limiting the distance each one of said pair of pushbuttons on said rotatable fasteners may be depressed.

23. The computer housing of claim 22, each said push button surface being visible and external to said computer housing when said computer case is engaged to said main chassis.

24. The computer housing of claim 21, wherein said biasing of one of said hooks being substantially opposite to said biasing of the other one of said hooks.

* * * * *